United States Patent [19]

Perloff et al.

[11] Patent Number: 4,703,252
[45] Date of Patent: Oct. 27, 1987

[54] APPARATUS AND METHODS FOR RESISTIVITY TESTING

[75] Inventors: David S. Perloff, Sunnyvale; Chester Mallory, Campbell, both of Calif.

[73] Assignee: Prometrix Corporation, Santa Clara, Calif.

[21] Appl. No.: 704,296

[22] Filed: Feb. 22, 1985

[51] Int. Cl.$^4$ .......................................... G01R 1/073
[52] U.S. Cl. ................................. 324/62; 324/158 P; 324/158 F
[58] Field of Search ...................... 29/874; 324/62, 64, 324/65 P, 158 R, 158 P, 158 F, 158 SC

[56] References Cited

U.S. PATENT DOCUMENTS

| | | | |
|---|---|---|---|
| 2,987,672 | 6/1961 | Marsh et al. | 324/62 R |
| 3,735,254 | 5/1973 | Severin | 324/64 |
| 4,035,722 | 7/1977 | Ryabov et al. | 324/158 P |
| 4,204,155 | 5/1980 | Jerry | 324/158 F |
| 4,213,086 | 7/1980 | Iida et al. | 324/64 |
| 4,267,506 | 5/1981 | Shiell | 324/64 |

FOREIGN PATENT DOCUMENTS 0896581  1/1982  U.S.S.R. .......................... 324/158 R

OTHER PUBLICATIONS

"Multiple Contactor Indexing Mechanism", by Perlman et al., IBM Tech. Disc. Bull., vol. 19, #2, 7/76, pp. 579–580.

Primary Examiner—Reinhard J. Eisenzopf
Assistant Examiner—William Burns
Attorney, Agent, or Firm—Flehr, Hohbach, Test, Albritton & Herbert

[57] ABSTRACT

An automatic sheet resistance mapping system for semiconductor wafers which has the capability of taking high accuracy, multiple test readings in both contour scan and diameter scan modes. A rotatable wafer stage carries a semiconductor wafer thereon with the center of the wafer positioned substantially at the axis of rotation of the wafer stage. A probe head assembly, including a linear array of at least four equally spaced probe tips projecting from one surface of the assembly is mounted facing the wafer stage on an arrangement for moving the probe tips alternately into and out of contact with the surface of a wafer carried thereon. Positioning arrangements are provided for rotating the wafer stage to accurately registered angular test positions and for producing translation between the wafer stage and the probe head assembly to position the array of probe tips at accurately registered radial test positions relative to the center of the wafer. The positioning arrangements are operable in a diameter scan mode to locate the probe tips at a multiplicity of successive, closely spaced test positions along a diameter line of the wafer and are operative in a contour scan mode to locate the probe tips at a two-dimensional array of different positions across the area of the wafer. The mounting arrangement for the probe head positions the probe head in a prearranged alignment position with the linear array of probe tips oriented at a prearranged small acute angle to a radius line so that the test probe tips each define a track of separated test probe footprints on the wafer in the diameter scan mode.

12 Claims, 12 Drawing Figures

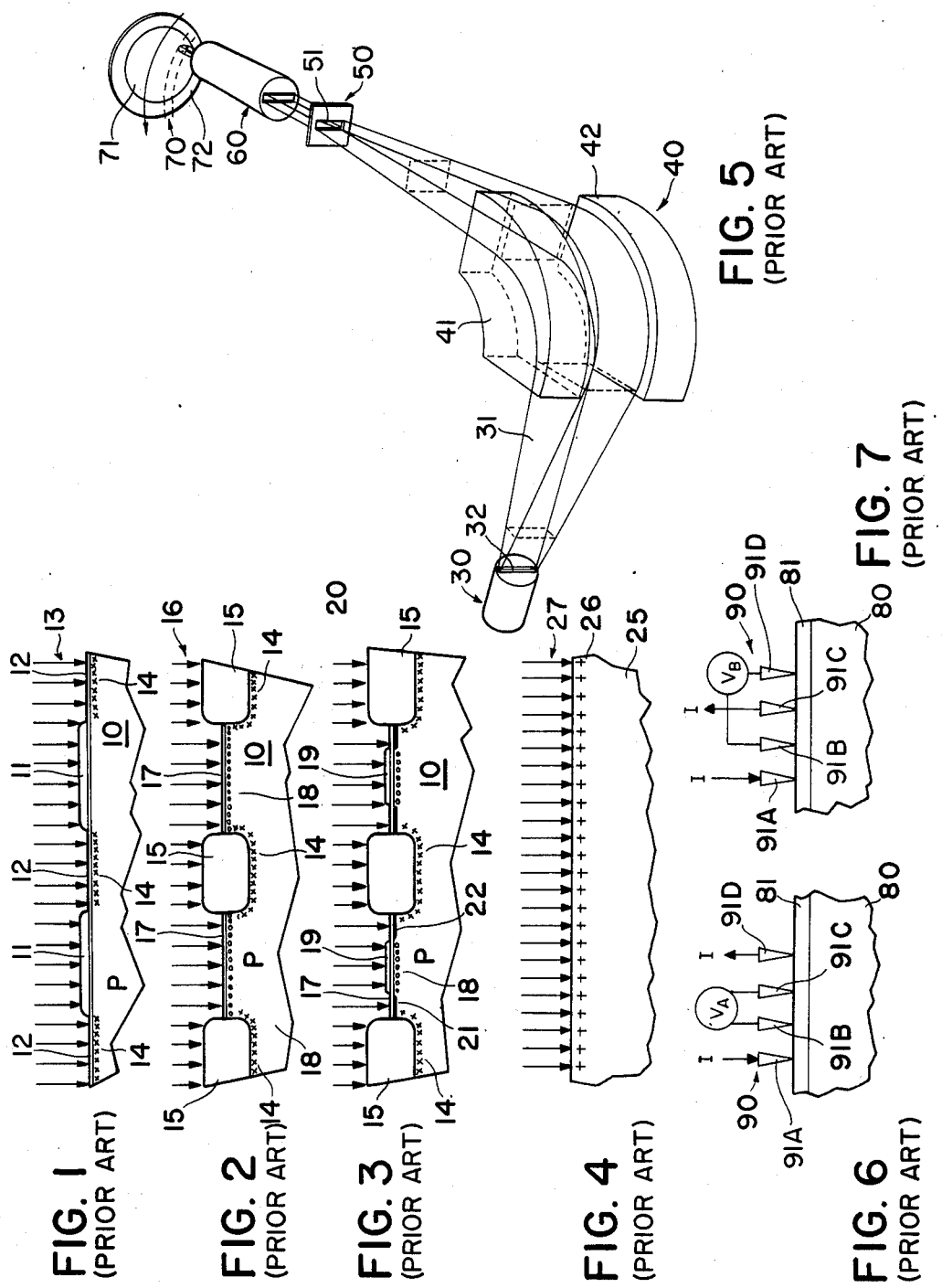

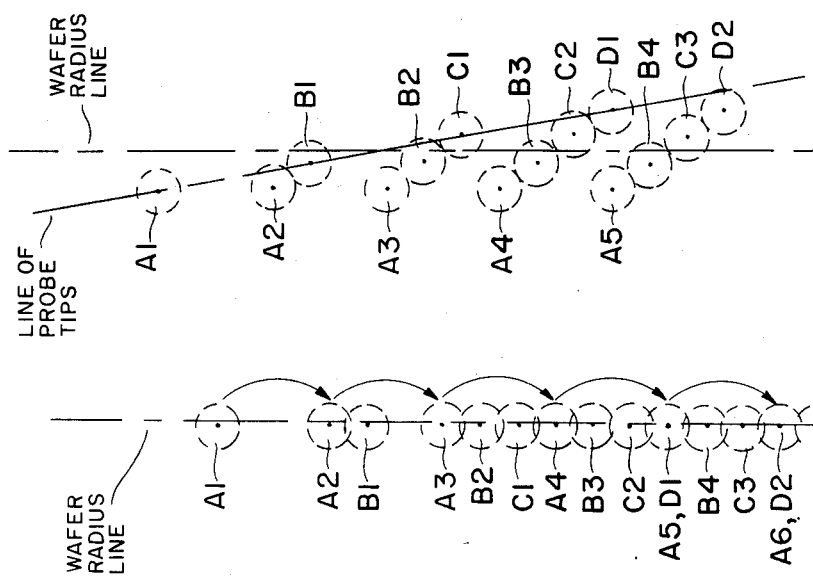
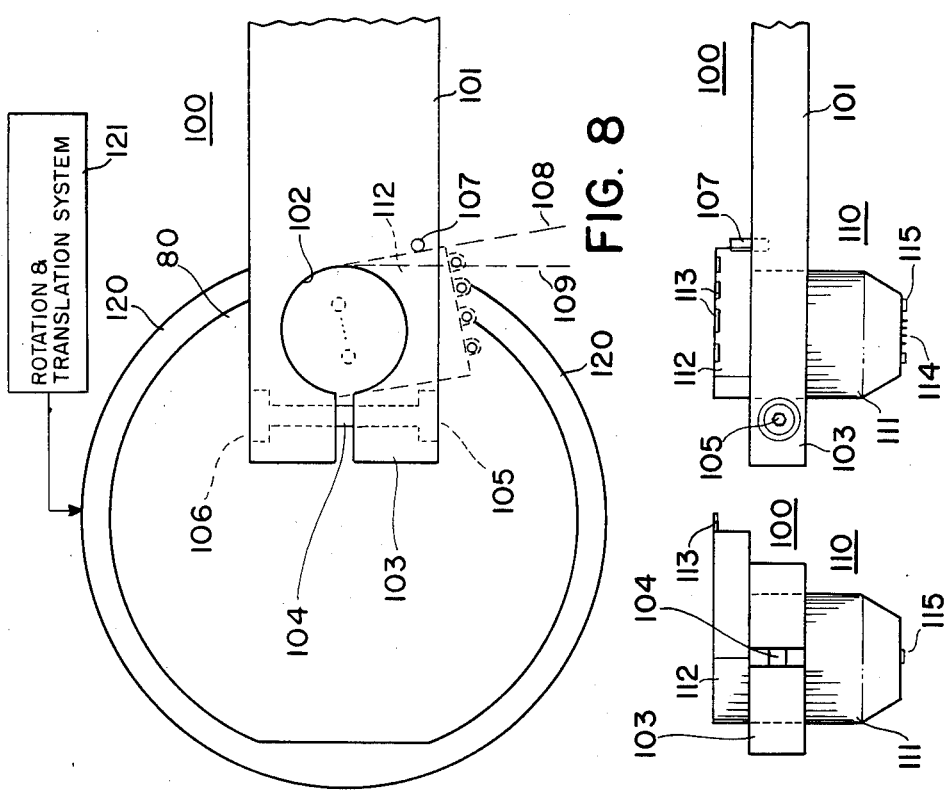

APPARATUS AND METHODS FOR RESISTIVITY TESTING

This invention relates generally to apparatus and methods for testing semiconductor wafers to ascertain the performance of semiconductor process equipment. More specifically, this invention relates to systems and methods for sheet resistance mapping of semiconductor wafers to test the performance of ion implantation equipment used in the process of manufacturing semiconductor devices such as large scale integrated circuit chips.

Large scale integrated circuits involve the integration on a single semiconductor chip of a large number of individual semiconductor devices which are interconnected into a completed circuit. Very great improvements in the scale of integration of semiconductor devices on integrated circuit (IC) chips and the speed of operation of such devices have been achieved over the past several years. In other words, improvements have resulted in substantially increased numbers of individual semiconductor devices being formed in the same area of a semiconductor chip. These improvements have been made possible by a number of advances in integrated circuit manufacturing equipment as well as improvements in the materials and methods utilized in processing virgin semiconductor wafers into IC chips. The most dramatic advances in manufacturing equipment have been improved apparatus for lithography and etching which define the device and circuit patterns and improved systems for implanting of conductivity modifying impurities into the semiconductor wafer.

Generally, the density of integrated circuits and their speed of operation are dependent largely upon the accuracy and resolution of the lithography and etching apparatus used to form the patterns of circuit elements in masking layers on the semiconductor wafer. However, density and speed are also dependent upon tight control of the profile of doped regions in the wafer, that is, regions to which substantial concentrations of conductivity modifying impurities have been added. Tight control of wafer doping can best be achieved in today's technology using ion implantation techniques and equipment. When ion implantation equipment is operating properly, highly uniform doping of the semiconductor wafer can be achieved. This will result in high yield of properly working integrated circuits if other aspects of the semiconductor processing are properly carried out. However, if the ion implantation equipment is malfunctioning so that improper or non-uniform dosages are present in the semiconductor wafer, the yield of properly working integrated circuit devices will fall off dramatically. Thus, it has become increasingly important in controlling the quality and yield of semiconductor processing to have effective in-process control monitoring of the proper operation of ion implantation systems.

FIGS. 1-3 illustrate the use of a sequence of ion implantation steps in fabricating conductor-insulator-silicon integrated circuit devices on a semiconductor wafer. FIG. 1 illustrates a first ion implantation step which may be performed on the P-type wafer 10 to produce a light implant in the field regions 14 of the wafer. Field regions 14 are defined at this point as the regions of the wafer which are not covered by the regions of photoresist 11. These regions of photoresist 11 are formed using a standard lithography process in which a thin layer of photoresist is spread over the entire surface of the wafer and then selectively exposed through a mask pattern or a directly scanned and modulated electron beam. This is followed by a developing step which removes areas of the photoresist which have been exposed to the light or to the electrons. A thin layer of thermal oxide 12 may be present over the exposed surfaces of the semiconductor so that the ion implantation in the field regions 14 will be made through the thin oxide layer.

A light implantation of ions of a P-type material such as boron (represented by the sequence of arrows designated 13) is performed using an ion implantation system. This field implant is done to provide greater electrical isolation between the active device regions which lie under the regions 11 of photoresist material.

After the implantation steps shown in FIG. 1, wafer 10 is typically placed in a furnace and thick field oxide regions 15 are grown in a wet oxidization process. During this oxidization process, the implanted ions 14 are driven into the semiconductor substrate to underlie the field oxide regions 15.

FIG. 2 shows a second ion implantation step, represented by the arrows designated 16, to implant an N-type dopant material, such as phosphorus, into the active device regions 18 of the wafer 10. This implant controls the threshold voltage of the transistor devices to be formed in the active device regions.

FIG. 3 illustrates a third ion implantation step in which a heavy implantation of N-type ions is performed to dope the source and drain regions 21 and 22 of the active semiconductor device elements. This heavy implant of N-type ions is represented by the arrows 20.

Since there are thousands of active device regions on each integrated circuit chip and dozens of integrated circuit chips on each wafer, it will be appreciated that the accuracy and uniformity of ion implantation doping of the semiconductor wafer during each implant is critical to achieving a good yield of working integrated circuit chips. In some semiconductor processes, as many as thirteen separate ion implantation steps are required in the fabrication process. A number of other processing operations are performed on a wafer after the step shown in FIG. 3 to complete the basic device structure and to interconnect the various semiconductor devices.

From the above brief explanation, it should be apparent that proper operation of the ion implantation equipment is a very critical element in successful fabrication of integrated circuit devices. Higher and higher levels of integration require greater and greater accuracy in each processing step and this can be assured only by regular in-process checking of the operation of the semiconductor equipment performing the various processing steps.

Resistivity mapping of test wafers has proven to be a very useful process control mechanism for characterizing the accuracy and uniformity of implant dosages supplied by the ion implant apparatus. FIG. 4 illustrates the uniform doping of the entire surface region 26 of a semiconductor wafer 25 with implanted ions represented by the arrows 27. Wafer 25 is strictly a test wafer which is processed through the ion implantation equipment, without lithography or other steps, simply to check the uniformity and accuracy of implant dosage in the implanted surface region 26 of the wafer.

FIG. 5 illustrates schematically the elements of an ion implantation system including an ion source arrangement 30 and analyzing magnet arrangement 40, a resolving slit arrangement 50, a post-acceleration system 60, and a wafer processing system 70. Ions which are generated in the ion source 30 are extracted to produce a ribbon beam directed to the pole gap of the analyzing magnet 40. In the pole gap between the upper pole 41 and the lower pole 42, the ions in the ion beam 31 are sorted according to their charge-to-mass ratio. The analyzing magnet system 40 converges the beam elements having the selected charge-to-mass ratio and focuses the selected beam through the aperture 51 in resolving slit arrangement 50. The resolved ion beam enters a post-acceleration system 60 where the ions are accelerated to a prearranged energy before striking the wafer 71 which is mounted on a heat sink arrangement 72 in the wafer handling apparatus 70.

The wafer handling apparatus 70 scans the wafers with respect to the ion beam in a two-dimensional pattern to provide uniformity of the entire wafer surface to the ions of the beam. (In other types of systems, the beam itself is scanned with respect to the wafer in one or two directions.) The control system for the ion implanter maintains uniformity of ion beam current. The combination of uniformity of beam current and uniformity of wafer scan produces uniformity of doping in the semiconductor wafer. However, if the scanning of the wafer with respect to the beam is non-uniform or the beam current magnitude varies substantially during the implant process, non-uniformity of implant dosages will be present across the surface of the semiconductor wafer.

The correctness and uniformity of implant dosage across the semiconductor wafer can be determined in an automatic sheet resistance mapping system which has the capability of taking multiple test readings in both a contour scan and diameter scan mode. It is well-known in the prior art to utilize an in-line four-point probe to make sheet resistance measurements at various preselected testing location on the implanted semiconductor test wafer. Sheet resistance mapping and the theory and results of such testing techniques are discussed in detail in the following papers and publications, which are incorporated herein by reference: D. S. Perloff et al. in the February 1981 issue of *Solid State Technology* entitled "Dose Accuracy and Doping Uniformity of Ion Implantation Equipment"; Andrew B. Wittkower in the September 1982 issue of *Solid State Technology* entitled "The Effect of Ion Implanter Design Upon Implant Uniformity"; and David S. Perloff in the November 1976 issue of *Solid-State Science and Technology*.

FIGS. 6 and 7 illustrate the two configuration resistivity probing technique which is preferred for accuracy in making sheet resistance measurements on a semiconductor test wafer. The four points of the probe 90 are shown in contact with the surface layer 81 of a semiconductor test wafer 80. A four-point probe is a mechanical device consisting of four spring-loaded metallic probe tips 91A–91D which are brought into contact with the surface of the wafer. FIG. 6 shows a standard probe configuration in which a constant electrical current is introduced into wafer through the outer probe tips 91A and 91D, and the voltage drop is measured across two inner probe tips 91B and 91C. In FIG. 7, an alternate probe configuration is shown in which the constant current is introduced through probe tips 91A and 91C and the voltage drop is measured across probe tips 91B and 91D. Use of these two test measurements makes it possible to determine sheet resistance to a high degree of accuracy even at testing positions which are near the edges of the semiconductor wafer.

To achieve maximum accuracy in performing four-point probe sheet resistance measurements on conductive surface layers of the wafer, it is necessary to orient the four probe points along an axis of symmetry of the layer to be measured. Thus, when measuring a circular layer such as on the typical circular semiconductor wafer, maximum accuracy dictates that the probe needles be lined up along the radius of the wafer.

Sheet resistance mapping is typically done in two different modes. The first mode is a contour scan mode in which multiple sheet resistance test readings are taken at various X,Y locations across the surface of the wafer. The test locations in a contour scan are usually sufficiently widely separated so that the probe tips contacting the semiconductor wafer surface at each test location will not be located at a point which has been previously contacted by a probe tip in an adjacent measurement position. Accordingly, contour scans may be performed with in-line probe tips oriented along radii of the wafer utilizing a rotating wafer stage to position the wafer at various accurate angular test positions and providing a translation motion between the probe head and the wafer for changing the radial position.

The second mapping mode is a diameter scan mode in which the probe tips are positioned at a multiplicity of test positions which are closely spaced along the radius of the wafer. If the in-line probe tips are oriented along the radius, some of the probe tips will touch the wafer surface at locations previously touched by other probe tips. Since the probe tip/wafer contact process inherently damages the surface of the conductive layer of the wafer, measurement accuracy is significantly reduced when contact is made with the damaged region. Accordingly, in automated sheet resistance mapping systems in the prior art, diameter scans have been typically made with the in-line probe tips oriented orthogonally (i.e., at a 90° angle) to the radius line of the wafer and the reduction in accuracy of measurement at the edge of the wafer has been simply tolerated.

In manual systems, such as shown in Kokusai Japanese Pat. No. 50-33082, it is convenient to provide for shifting the angle of the probe tips from a orientation parallel to a radius to an orientation orthogonal to a radius line of the wafer. The parallel orientation can be used for contour scans and the orthogonal orientation for diameter scans. However, in automated sheet resistance mapping systems of the prior art, the probe tips have been maintained at the orthogonal position for both contour scan and diameter scan modes of operation since it is inconvenient to shift the probe tip orientation.

It is an object of this invention to provide an improved automated sheet resistance mapping system.

It another object of this invention to provide an automated sheet resistance mapping system with higher measurement accuracy at the edges of the semiconductor wafer.

It is a further object of this invention to provide an improved method of performing sheet resistance mapping measurement on a semiconductor wafer in a diameter scan mode.

The objects of this invention are achieved in an automated sheet resistance mapping system which has the capability of taking multiple test readings in both contour scan and diameter scan modes. The system employs a rotatable wafer stage for carrying a semiconductor wafer thereon with the center of the wafer positioned substantially at the axis of rotation of the wafer stage. A probe head assembly which includes a linear array of at least four equally spaced probe tips projecting from one surface thereof is mounted on a mounting arrangement which places the probe tip surface facing the wafer stage and the wafer thereon and moves the array of probe tips alternately into and out of contact with the surface of the wafer. A first positioning arrangement rotates the wafer stage to accurately registered angular test positions and a second positioning arrangement produces translation between the wafer stage and the probe head assembly to position the array of probe tips at accurately registered radial test positions relative to the center of the wafer. The first and second positioning means operates in the diameter scan mode to locate the probe tips at a multiplicity of successive, closely spaced positions along a diameter line of the wafer and are operative in a contour scan mode to locate the probe tips at a two dimensional array of different test positions across the area of the wafer. The mounting arrangement positions the probe head in a prearranged alignment position with the linear array of probe tips oriented at a predetermined small acute angle to a radius line of the wafer such that the test probe tips each define a track of separated test probe footprints on the wafer in the diameter scan mode. In other words, each of the test probe tips moves in a separate path and does not step on damage track footprints made by other test probe tips in previous test positions of the probe.

In an exemplary preferred embodiment, the probe tips are spaced from each other about 0.040 inch and the acute angle of orientation of the probe tips relatively to the radius line is in the range of about five degrees to fifteen degress depending on the size of the test footprint of the probe tips on the wafer.

The above objects are also achieved in a method of performing sheet resistance mapping measurements on a semiconductor wafer in a diameter scan mode with the method including the step of disposing a probe head assembly with a linear array of separated probe tips thereon adjacent to surface of the wafer with the linear array oriented at a prearranged small acute angle to a radius line of the wafer such that the probe tip footprints made by contact with the wafer surface will be separated in a direction orthogonal to the radius line. The next step is to translate the probe head assembly relative to the wafer along a radius line to position the probe tips at a multiplicity of closely spaced test point locations. Finally, the wafer surface is contacted with the probe tips at each test point location thereby producing separate tracks of test probe footprints along the radius line. In this manner, the individual probe tips always step into a fresh surface location of the wafer but the in-line probe tips are, for all practical purposes and, from a measurement accuracy standpoint, aligned with a radius line of the wafer.

It will thus be appreciated that the use of the system and method of this invention enables an automated sheet resistance mapping system to maintain a single test probe orientation relative to the wafer while achieving both high accuracy of measurement at test positions near the wafer edge and high accuracy of measurements in the diameter scan mode by maintaining fresh probe tip contact positions along the diameter or radius line of the wafer. Therefore, high accuracy measurement at all test positions in both the diameter scan mode and contour scan mode of operation of an automated sheet resistance mapping system is achieved.

Other objects, features and advantages of this invention will be apparent from the detailed description of a preferred embodiment given below in conjunction with the accompanying drawings.

FIGS. 1-3 illustrate process steps in the manufacture of a semiconductor integrated circuit utilizing various ion implantation steps.

FIG. 4 illustrates ion implantation of a test wafer for testing uniformity of the ion implant dosage across the entire surface.

FIG. 5 is a schematic illustration of ion implantation apparatus of the prior art.

FIGS. 6 and 7 illustrate alternate in-line test probe measurements in accordance with the prior art.

FIG. 8 is a top plan view of a resistivity test probe mounting arrangement in accordance with this invention.

FIG. 9 is a side elevational view of the test probe mounting arrangement depicted in FIG. 8.

FIG. 10 is a side elevational view of the test probe mounting arrangement depicted in FIG. 8.

FIG. 11 is a schematic illustration of the succession of probe tip footprints on a semiconductor wafer in a diameter scan mode with the probe tips aligned with the scan path along the radius.

FIG. 12 is schematic illustration of the path of probe tip footprints in a diameter scan mode utilizing the test probe mounting arrangement in accordance with this invention.

Referring now to FIGS. 8-10, the arrangement for mounting a test probe in accordance with this invention will be described. A cantilevered probe mounting arm arrangement 100 includes a cantilevered mounting arm 101 having a probe receiving aperture 102 near one end thereof. A split C clamp arrangement 103 incorporates a bolt 104 with an adjustment head 105 on one end thereof and a fastening nut 106 on the other end thereof. The probe mounting arm 101 suspends the test probe assembly 110 over a semiconductor wafer 80 and an arrangement (not shown) is provided for lowering the test probe assembly 110 such that the test probe tips 114 and the stop pads 115 on the bottom of the test probe assembly 110 contact the surface of the semiconductor wafer.

A typical configuration for test probe assembly 110 is a cylindrical-shaped central body section 111 which is received within the aperture 102 in the mounting arm 101. A generally rectangular flange 112 rests on a top surface of the mounting arm 101 and has a plurality of electrodes 113 connected to the test probe tips 114 for making connection to the input/output signal processing circuits in conventional manner. The clamping arrangement 103 of the probe mounting arm is tightened to hold the test probe assembly 110 in a fixed orientation on the mounting arm 101.

As shown in FIGS. 8-10, in accordance with this invention, the test probe assembly 110 is oriented in the mounting aperture 102 in a prearranged alignment position such that the in-line probe tips 114 are oriented at a predetermined small acute angle to the radius line of the wafer 80 (e.g., about ten degrees in this case). A probe assembly orientation arrangement is provided on the mounting arm 101 in the form of an alignment post 107 which provides a stop for the edge of the flange portion 112 of the probe tip assembly 110. Other approaches, such as alignment markers located on the mounting arm 101 could be utilized to provide alignment orientation of the test probe assembly. It would also be possible to use an arrangement of a key on the cylindrical section 111 of the test probe assembly and a keyway in the aperture 102 so that the probe head assembly would mount in the aperture 102 only in one prearranged orientation corresponding to the desired angle for the test probe tips.

As illustrated in FIGS. 8–10, the test probe tips are oriented at about ten degrees to the radius line. As shown in FIG. 8, the probe alignment post 107 is positioned along a line 108 from the edge of the aperture 102 which is at a ten degree angle to the line 109 which is orthogonal to the radius line of the wafer and the center line of the probe mounting arm 101. The alignment post 107 is a preferred alignment system since it permits easy positioning of the test probe assembly 110 in the correct orientation when the mounting arm is in a position such that the top surface thereof cannot be viewed by the person inserting the probe. The test probe assembly 110 can simply be inserted with its barrel 111 in the aperture 102 and then rotated until the edge surface of the flange portion 112 contacts the alignment post 107. The C-clamp arrangement 103 can then be tightened by means of the bolt head 105 to lock the test probe assembly 110 in place in the correct orientation. The unit is then ready to perform a contour scan or diameter scan mode of operation of the resistivity test system in which it is incorporated.

The probe mounting arm 101 may be a modified version of the probe arm to be mounted on a Kokusai Model VR30A or VR30B resistivity test unit available from Kokusai Electric Company of Japan. This overall resistivity test unit is preferably part of an automated resistivity test system available from Prometrix Corporation of Santa Clara, Calif., and marketed as the OM-NIMAP TM System.

As shown in FIG. 8, the wafer 80 preferably rests on a wafer stage 120 which is associated with a rotation and translation system 121. Rotation and translation system 121 includes a mechanism to rotate the wafer stage 120 about its center with the wafer 80 positioned on the stage 120 such that its center substantially coincides with that of the wafer stage. The rotation and translation system 121 provides for accurately rotating wafer 80 to various angular positions. It also includes another mechanism for translating the wafer stage 120 relative to the probe head assembly 110 so that the probe head assembly can be positioned at various radial locations in a very accurate manner. The above-referenced Kokusai resistivity test unit has specific features for carrying out these functions. Accordingly, a detailed disclosure of the actual mechanisms for rotation and translation of the wafer stage need not be disclosed herein.

FIG. 11 shows, in a highly enlarged fashion, the sequence of damage tracks which are produced on a semiconductor wafer when the probe tips of an in-line test probe are scanned in small increments in a diameter scan mode of resistivity testing. The illustration in FIG. 11 corresponds to a test probe having probe tips which are spaced about 0.040 inch apart and stepping in 0.030 inch steps along the radius of the wafer with the line of probe tips aligned substantially along the radius line of the wafer which is being scanned. The initial probe tip positions are designated A1, B1, C1, and D1. As can be seen in FIG. 11, after four steps at 0.030 inch increments, the probe tip A is at position A5 which corresponds substantially to the initial position D1 of probe tip D. Thereafter, the probe tip A will always be stepping on a damage track footprint created by the earlier contact position of the probe tip D. Of course, if the scan distance is exactly equal to the distance between the probe tips, each of the three probe tips, other than the first probe tip, will be stepping on the damage track footprint of another tip as the diameter scan proceeds.

As is well-known, test probe assemblies are available with a number of different probe tip spacings and different probe tip sizes. If the probe tips are aligned with the wafer radius and the step between test point locations is about the same as the probe tip spacing, as is conventional in a diameter scan, at some point one or more of the probe tips at each test position will be contacting a damage track footprint from a prior test position of one of the other probe tips. This reduces sheet resistance measurement accuracy up to five percent. Because of this tendency, the prior art systems utilizing automatic scan of the wafer for both diameter scan and contour scan modes oriented the in-line probe tips orthogonal to the radius line being tested and sacrificed measurement accuracy at the edge of the wafer. This inaccuracy of measurement at the wafer edge can be as much as five percent.

It can be seen from the illustration of FIG. 12 that a ten degree off-radius orientation of the in-line probe tips A1, B1, C1, and D1 enables the diameter scan mode of the system to be used without any of the probe tips stepping in a damage track as the test probe steps from position to position along the radius. Each of the probe tips traces out its own path parallel to the radius line and the damage tack footprints remain separate throughout the length of the scan. As shown in FIG. 12, in the fifth position of the probe tip A, designated A5, the tip is spaced from the damage track of the probe tip D in its position D1. It can also be seen from FIG. 12 that the distance between the damage tracks from the A2 position to the B1 position is improved for accuracy of measurement as well.

The angle that the linear probe tip array is oriented with respect to the radius line can be arranged as a function of the size of the probe tip and the size of the damage track which is created on the wafer. An orientation in the range of five to fifteen degrees is preferred, but larger orientations up to as much as twenty degrees could be utilized without substantially degrading the accuracy of resistivity test measurements at the edge of the wafer.

While preferred embodiments of the apparatus and method of this invention have been described above in conjunction with the accompanying drawings, it should be understood that persons of ordinary skill in the art could readily modify the described embodiments in a number of respects to achieve substantially the same function. Numerous changes could be made without departing from the scope of the invention as claimed in the following claims.

What is claimed is:

1. In an automatic sheet resistance mapping system for semiconductor wafers having a capability of taking multiple test readings in both contour scan and diameter scan modes, in combination:
    a rotatable wafer stage for carrying a semiconductor wafer thereon with a center of said wafer positioned substantially at an axis of rotation of said wafer stage;

a probe head assembly including a linear array of at least four equally spaced probe tips projecting from one surface thereof;

mounting means for mounting said probe head assembly with said one surface facing said wafer stage and for moving said array of probe tips alternately into and out of contact with the surface of a wafer carried on said wafer stage;

first positioning means for rotating said wafer stage to accurately registered angular test positions; and second positioning means for producing translation between said wafer stage and said probe head assembly to position said array of probe tips at accurately registered radial test positions relative to the center of said wafer;

said first and second positioning means being operable in said diameter scan mode to locate said probe tips at a multiplicity of successive closely spaced test positions along a diameter line of said wafer and being operative in said contour scan mode to locate said probe tips at a two-dimensional array of different test positions across an area of said wafer;

said mounting means including means for mounting said probe head in a prearranged alignment position with said linear array of probe tips oriented at a prearranged small acute angle to said diameter line of said wafer as said second positioning means move said probe tips along said diameter line such that said probe tips each define a track of separated test probe footprints on said wafer in said diameter scan mode.

2. The system of claim 1, wherein said probe tips are spaced from each other by about 0.040 inch, and said acute angle of orientation is in a range of about five degrees to fifteen degrees.

3. The system of claim 2, wherein said acute angle to said radius line is about ten degrees.

4. The system of claim 1, wherein said mounting means includes securing means for releasably securing said probe head assembly in a fixed orientation and alignment means for indicating said prearranged alignment position for said probe head assembly.

5. The system of claim 4, wherein said test probe assembly includes a cylindrical body portion and a flange on one end opposite said probe tips, said securing means comprises clamping means for releasably clamping around said cylindrical body portion of said test probe assembly in a fixed orientation, and said alignment means comprises a stop means carried on said clamping means at a registered position and adapted to contact said flange to establish said preselected alignment position of said test probe assembly.

6. In an automatic sheet resistance mapping system for semiconductor wafers having a capability of taking multiple test readings in both contour scan and diameter scan modes, in combination:

a rotatable wafer stage for carrying a semiconductor wafer thereon with a center of said wafer positioned substantially at an axis of rotation of said wafer stage;

a probe head assembly including a linear array of four probe tips projecting from one surface thereof and being equally spaced for each other by a known separation;

mounting means for mounting said probe head assembly with said one surface facing said wafer stage and for moving said array of probe tips alternately into and out of contact with the surface of a wafer carried on said wafer stage;

first positioning means for rotating said wafer stage to accurately registered angular test positions; and second positioning means for producing translation between said wafer stage and said probe assembly to position said array of probe tips at accurately registered radial test positions relative to the center of said wafer;

said first and second positioning means being operable in said diameter scan mode to locate said probe tips at a multiplicity of successive, closely spaced test positions along a diameter line of said wafer and being operable in said contour scan mode to locate said probe tips at a two-dimensional array of widely spaced test positions distributed across an area of said wafer surface;

said test probe assembly including a cylindrical body portion and flange on one end of said body portion opposite said probe tips;

said mounting means including clamping means for releasably clamping said cylindrical body portion of said test probe assembly in a fixed orientation and a stop means carried on said clamping means at a registered position and adapted to contact said flange of said test probe assembly to establish a preselected alignment position of said probe head assembly such that said linear array of probe tips is oriented at a prearranged small acute angle to said diameter line of said wafer along which said probe head assembly is moved by said second positioning means, said angle having a magnitude selected as a function of said known probe tip separation such that each of said probe tips defines a separate track of test point footprints in said diameter scan mode while maintaining a substantially radial oreintation of said probe tips for improved measurement accuracy at test positions near an edge of said wafer in both said diameter scan mode and sand contour scan mode.

7. The system of claim 6, wherein said probe tips are spaced from each other by about 0.040 inch, and said acute angle to said diameter line is in a range of about five degrees to fifteen degrees.

8. The system of claim 7, wherein said acute angle of orientation is about ten degrees.

9. In a method of performing sheet resistance mapping measurements on a semiconductor wafer in a diameter scan mode, the steps of:

disposing a probe head assembly with a linear array of separated probe tips thereon adjacent a surface of said wafer with said linear array oriented at a prearranged small acute angle of orientation to a radius line of said wafer such that probe tip footprints made by contact with said wafer surface will be separated in a direction orthogonal to said radius line;

translating said probe head assembly relative to said wafer along said radius line to position said probe tips at a multiplicity of closely spaced test point locations while maintaining a constant acute angle of orientation of said probe tip array relative to said radius line; and contacting said wafer surface with said probe tips at each test point location, thereby producing separate tracks of test probe footprints along said radius line.

10. The method of claim 9, wherein said probe tips are spaced from each other by about 0.040 inch, and said acute angle of orientation is in a range of about five degrees to fifteen degrees.

11. The method of claim 10, wherein said acute angle of orientation is about ten degrees.

12. The method of claim 9 adapted for performing sheet resistance mapping measurements on semiconductor wafers in both a diameter scan mode and a contour scan mode and including the following additional steps in said contour scan mode:

translating said probe head assembly relative to said wafer from edge to center of one of said semiconductor wafers to position said probe tips at a multiplicity of widely spaced radial test locations;

rotating said wafer about its center while said probe tips are at each radial test location to position said probe tips at a multiplicity of widely spaced angular test point locations; and contacting said wafer surface with said probe tips at each of said angular test point locations, said small acute angle or orientation of said probe tips maintaining said orientation substantially along the diameter line of said wafer and thereby producing better measurement accuracy at test point locations near the edge of said wafer than mapping methods wherein said probe tips are parallel, or perpendicular, to a wafer diameter line.

* * * * *